(12) United States Patent
Sharon et al.

(10) Patent No.: US 8,775,901 B2
(45) Date of Patent: Jul. 8, 2014

(54) DATA RECOVERY FOR DEFECTIVE WORD LINES DURING PROGRAMMING OF NON-VOLATILE MEMORY ARRAYS

(75) Inventors: Eran Sharon, Rishon Lezion (IL); Idan Alrod, Herzilya (IL)

(73) Assignee: Sandisk Technologies, Inc., Plano, TX (US)

( * ) Notice: Subject to any disclaimer, the term of this patent is extended or adjusted under 35 U.S.C. 154(b) by 207 days.

(21) Appl. No.: 13/193,148

(22) Filed: Jul. 28, 2011

(65) Prior Publication Data

US 2013/0031429 A1    Jan. 31, 2013

(51) Int. Cl.
G11C 29/00    (2006.01)
G11C 29/04    (2006.01)
G06F 11/10    (2006.01)

(52) U.S. Cl.
CPC ............... *G11C 29/04* (2013.01); *G11C 29/82* (2013.01); *G06F 11/1072* (2013.01)
USPC ........................................................ 714/763

(58) Field of Classification Search
CPC ..... G11C 29/04; G11C 29/82; G11C 11/1072
USPC ........................ 714/746, 758, 763–764, 773
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,172,338 A | 12/1992 | Mehrotra et al. |
| 5,313,421 A | 5/1994 | Guterman et al. |
| 5,315,541 A | 5/1994 | Harari et al. |
| 5,321,699 A | 6/1994 | Endoh et al. |
| 5,335,198 A | 8/1994 | Van Buskirk et al. |
| 5,343,063 A | 8/1994 | Yuan et al. |

(Continued)

FOREIGN PATENT DOCUMENTS

| | | |
|---|---|---|
| EP | 709782 A1 | 5/1996 |
| EP | 2 261 806 | 12/2010 |
| WO | WO 2007/016167 | 2/2007 |
| WO | WO 2009/050703 | 4/2009 |

OTHER PUBLICATIONS

Notification of Transmittal of the International Search Report and the Written Opinion of the International Searching Authority, or the Declaration for Int'l Application No. PCT/US2012/048080 mailed Oct. 25, 2012, 11 pages.

(Continued)

*Primary Examiner* — Shelly A Chase
(74) *Attorney, Agent, or Firm* — Davis Wright Tremaine LLP

(57) ABSTRACT

The recovery of data during programming, such as in the case of a broken word-line, is considered. The arrangement described assumes that k pages may be corrupted when the system finishes programming a block. Then these corrupted pages can be recovered using an erasure code. In order to recover any k pages, the system will compute and temporarily store k parity pages in the controller. These k parity pages may be computed on-the-fly as the data pages are received from the host. After programming the block if a problem is detected in a post-write read, and data in up to k pages is corrupt on some bad word-lines, then the missing data is recovered using the k parity pages that are stored in the controller and using the other non-corrupted pages that are read from the block of the memory array and decoded.

31 Claims, 11 Drawing Sheets

(56) References Cited

U.S. PATENT DOCUMENTS

| | | |
|---|---|---|
| 5,386,422 A | 1/1995 | Endoh et al. |
| 5,428,621 A | 6/1995 | Mehrotra et al. |
| 5,436,587 A | 7/1995 | Cernea |
| 5,469,444 A | 11/1995 | Endoh et al. |
| 5,570,315 A | 10/1996 | Tanaka et al. |
| 5,595,924 A | 1/1997 | Yuan et al. |
| 5,602,789 A | 2/1997 | Endoh et al. |
| 5,661,053 A | 8/1997 | Yuan |
| 5,671,388 A | 9/1997 | Hasbun |
| 5,673,222 A | 9/1997 | Fukumoto et al. |
| 5,768,192 A | 6/1998 | Eitan |
| 5,822,256 A | 10/1998 | Bauer et al. |
| 5,867,429 A | 2/1999 | Chen et al. |
| 5,903,495 A | 5/1999 | Takeuchi et al. |
| 5,930,167 A | 7/1999 | Lee et al. |
| 6,011,725 A | 1/2000 | Eitan |
| 6,046,935 A | 4/2000 | Takeuchi et al. |
| 6,064,591 A | 5/2000 | Takeuchi et al. |
| 6,134,140 A | 10/2000 | Tanaka et al. |
| 6,185,709 B1 | 2/2001 | Dreibelbis et al. |
| 6,205,055 B1 | 3/2001 | Parker |
| 6,215,697 B1 | 4/2001 | Lu et al. |
| 6,219,276 B1 | 4/2001 | Parker |
| 6,219,286 B1 | 4/2001 | Fuchigami et al. |
| 6,222,762 B1 | 4/2001 | Guterman et al. |
| 6,285,597 B2 | 9/2001 | Kawahara et al. |
| 6,370,075 B1 | 4/2002 | Haeberli et al. |
| 6,456,528 B1 | 9/2002 | Chen |
| 6,556,465 B2 | 4/2003 | Haeberli et al. |
| 6,560,143 B2 | 5/2003 | Conley et al. |
| 6,625,061 B2 | 9/2003 | Higuchi |
| 6,760,262 B2 | 7/2004 | Haeberli et al. |
| 6,913,823 B2 | 7/2005 | Pinton et al. |
| 6,914,823 B2 | 7/2005 | Chen et al. |
| 6,917,542 B2 | 7/2005 | Chen et al. |
| 6,917,543 B2 | 7/2005 | Sato |
| 6,922,096 B2 | 7/2005 | Cernea |
| 7,009,889 B2 | 3/2006 | Tran et al. |
| 7,012,835 B2 | 3/2006 | Gonzalez et al. |
| 7,030,683 B2 | 4/2006 | Pan et al. |
| 7,135,910 B2 | 11/2006 | Cernea |
| 7,158,421 B2 | 1/2007 | Li et al. |
| 7,170,802 B2 | 1/2007 | Cernea |
| 7,206,230 B2 | 4/2007 | Li et al. |
| 7,243,275 B2 | 7/2007 | Gongwer et al. |
| 7,304,893 B1 | 12/2007 | Hemink |
| 7,345,928 B2 | 3/2008 | Li |
| 7,368,979 B2 | 5/2008 | Govindu et al. |
| 7,376,011 B2 | 5/2008 | Conley et al. |
| 7,428,180 B2 | 9/2008 | Kim |
| 7,440,319 B2 | 10/2008 | Li et al. |
| 7,554,311 B2 | 6/2009 | Pan |
| 7,616,484 B2 | 11/2009 | Auclair et al. |
| 7,616,499 B2 | 11/2009 | Wan et al. |
| 7,683,700 B2 | 3/2010 | Huynh et al. |
| 7,716,538 B2 | 5/2010 | Gonzalez et al. |
| 7,795,952 B2 | 9/2010 | Lui et al. |
| 7,843,732 B2 | 11/2010 | Lee et al. |
| 7,864,578 B2 | 1/2011 | Takada e |
| 7,864,588 B2 | 1/2011 | Betser et al. |
| 7,969,235 B2 | 6/2011 | Pan |
| 7,973,592 B2 | 7/2011 | Pan |
| 8,027,195 B2 | 9/2011 | Li et al. |
| 8,040,744 B2 | 10/2011 | Gorobets et al. |
| 8,054,680 B2 | 11/2011 | Matsuzaki et al. |
| 8,102,705 B2 | 1/2012 | Liu et al. |
| 2001/0015932 A1 | 8/2001 | Akaogi et al. |
| 2002/0007386 A1 | 1/2002 | Martin et al. |
| 2003/0117851 A1 | 6/2003 | Lee et al. |
| 2003/0217323 A1 | 11/2003 | Guterman et al. |
| 2004/0022092 A1 | 2/2004 | Dvir et al. |
| 2005/0024939 A1 | 2/2005 | Chen et al. |
| 2005/0068802 A1 | 3/2005 | Tanaka |
| 2005/0160316 A1 | 7/2005 | Shipton |
| 2005/0219896 A1 | 10/2005 | Chen et al. |
| 2006/0090112 A1 | 4/2006 | Cochran et al. |
| 2006/0098505 A1 | 5/2006 | Cho et al. |
| 2006/0140007 A1 | 6/2006 | Cernea |
| 2006/0221714 A1 | 10/2006 | Li et al. |
| 2006/0227602 A1 | 10/2006 | Honma et al. |
| 2006/0239111 A1 | 10/2006 | Shingo |
| 2007/0030732 A1 | 2/2007 | Micheloni et al. |
| 2007/0126494 A1 | 6/2007 | Pan |
| 2007/0139099 A1 | 6/2007 | Pan |
| 2007/0171719 A1 | 7/2007 | Hemink |
| 2007/0201274 A1 | 8/2007 | Yu et al. |
| 2007/0234183 A1 | 10/2007 | Hwang et al. |
| 2007/0280000 A1 | 12/2007 | Fujiu et al. |
| 2007/0296391 A1 | 12/2007 | Bertin et al. |
| 2008/0062770 A1 | 3/2008 | Tu Loc et al. |
| 2008/0177956 A1 | 7/2008 | Peddle |
| 2008/0301532 A1 | 12/2008 | Uchikawa et al. |
| 2008/0307342 A1 | 12/2008 | Furches et al. |
| 2009/0058506 A1 | 3/2009 | Nandi et al. |
| 2009/0058507 A1 | 3/2009 | Nandi et al. |
| 2009/0063918 A1 | 3/2009 | Chen et al. |
| 2009/0073763 A1 | 3/2009 | Hosono |
| 2009/0100290 A1 | 4/2009 | Nakanishi et al. |
| 2009/0153230 A1 | 6/2009 | Pan et al. |
| 2009/0153232 A1 | 6/2009 | Fort et al. |
| 2009/0190397 A1 | 7/2009 | Cho et al. |
| 2009/0225607 A1 | 9/2009 | Chen et al. |
| 2009/0228739 A1 | 9/2009 | Cohen |
| 2009/0287874 A1 | 11/2009 | Rogers et al. |
| 2009/0295434 A1 | 12/2009 | Umeda et al. |
| 2009/0310423 A1 | 12/2009 | Lo et al. |
| 2009/0315616 A1 | 12/2009 | Nguyen et al. |
| 2009/0316483 A1 | 12/2009 | Kim et al. |
| 2009/0322413 A1 | 12/2009 | Huynh et al. |
| 2010/0027336 A1 | 2/2010 | Park et al. |
| 2010/0054019 A1 | 3/2010 | Toda |
| 2010/0070209 A1 | 3/2010 | Sai |
| 2010/0082881 A1 | 4/2010 | Klein |
| 2010/0091568 A1 | 4/2010 | Li et al. |
| 2010/0091573 A1 | 4/2010 | Li et al. |
| 2010/0131809 A1 | 5/2010 | Katz |
| 2010/0148856 A1 | 6/2010 | Lui et al. |
| 2010/0172180 A1 | 7/2010 | Paley et al. |
| 2010/0174845 A1 | 7/2010 | Gorobets et al. |
| 2010/0174846 A1 | 7/2010 | Paley et al. |
| 2010/0174847 A1 | 7/2010 | Paley et al. |
| 2011/0013457 A1 | 1/2011 | Han |
| 2011/0035538 A1 | 2/2011 | Kim et al. |
| 2011/0063918 A1 | 3/2011 | Pei et al. |
| 2011/0066793 A1 | 3/2011 | Burd |
| 2011/0096601 A1 | 4/2011 | Gavens et al. |
| 2011/0099418 A1 | 4/2011 | Chen |
| 2011/0099460 A1 | 4/2011 | Dusija et al. |
| 2011/0145633 A1 | 6/2011 | Dickens et al. |
| 2011/0148509 A1 | 6/2011 | Pan |
| 2011/0149651 A1 | 6/2011 | Gorobets et al. |
| 2011/0161784 A1 | 6/2011 | Selinger et al. |
| 2011/0182121 A1 | 7/2011 | Dutta et al. |
| 2012/0008384 A1 | 1/2012 | Li et al. |
| 2012/0008405 A1 | 1/2012 | Shah et al. |
| 2012/0008410 A1 | 1/2012 | Huynh et al. |
| 2012/0311407 A1* | 12/2012 | Lee et al. .................... 714/768 |

OTHER PUBLICATIONS

U.S. Appl. No. 13/332,780 entitled "Simultaneous Sensing of Multiple Wordlines and Detection of NAND Failures," filed Dec. 21, 2011, 121 pages.

U.S. Appl. No. 13/193,083 entitled "Non-Volatile Memory and Method with Accelerated Post-Write Read Using Combined Verification of Multiple Pages," filed Jul. 28, 2011, 100 pages.

U.S. Appl. No. 11/303,387 entitled "Charge Pump Regulation Control for Improved Power Efficiency," filed Dec. 16, 2011, 25 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

(56) References Cited

OTHER PUBLICATIONS

Pan, "Charge Pump Circuit Design," McGraw-Hill, 2006, 26 pages.

Pylarinos et al., "Charge Pumps: An Overview," Department of Electrical and Computer Engineering University of Toronto, 7 pages. 2001.

U.S. Appl. No. 12/506,998 entitled "Charge Pump with Current Based Regulation," filed Jul. 21, 2009, 21 pages.

U.S. Appl. No. 12/640,820 entitled "Techniques to Reduce Charge Pump Overshoot," filed Dec. 17, 2009, 28 pages.

U.S. Appl. No. 12/833,146 entitled "Detection of Word-Line Leakage in Memory Arrays," filed Jul. 9, 2010, 57 pages.

U.S. Appl. No. 12/833,167 entitled "Detection of Broken Word-Lines in Memory Arrays," filed Jul. 9, 2010, 55 pages.

U.S. Appl. No. 13/016,732 entitled "Detection of Word-Line Leakage in Memory Arrays: Current Based Approach," filed Jan. 28, 2011, 77 pages.

U.S. Appl. No. 12/642,649 entitled "Data Transfer Flows for On-Chip Folding," filed Dec. 18, 2009, 73 pages.

U.S. Appl. No. 12/642,584 entitled "Maintaining Updates of Multi-Level Non-Volatile Memory in Binary Non-Volatile Memory," filed Dec. 18, 2009, 76 pages.

U.S. Appl. No. 12/642,740 entitled "Non-Volatile Memory and Method With Atomic Program Sequence and Write Abort Detection," filed Dec. 18, 2009, 63 pages.

U.S. Appl. No. 12/642,611 entitled "Non-Volatile Memory with Multi-Gear Control Using On-Chip Folding of Data," filed Dec. 18, 2009, 74 pages.

U.S. Appl. No. 13/280,217 entitled "Post-Write Read in Non-Volatile Memories Using Comparison of Data as Written in Binary and Multi-State Formats," filed Oct. 24, 2011, 110 pages.

U.S. Appl. No. 13/101,765 entitled "Detection of Broken Word-Lines in Memory Arrays," filed May 5, 2011, 63 pages.

U.S. Appl. No. 61/495,053 entitled "Balanced Performance for On-Chip Folding on Non-Volatile Memories," filed Jun. 9, 2011, 86 pages.

U.S. Appl. No. 61/142,620 entitled "Balanced Performance for On-Chip Folding on Non-Volatile Memories," filed Jun. 9, 2011, 144 pages.

\* cited by examiner

Programming into two states represented by a 1-bit code

Programming into four states represented by a 3-bit code

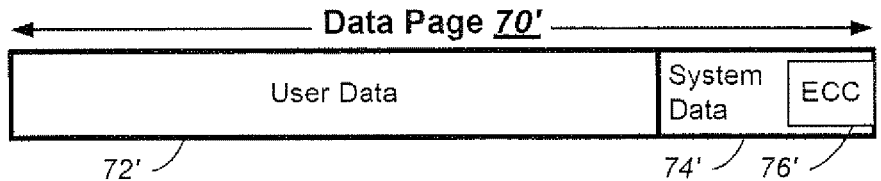
FIG. 9
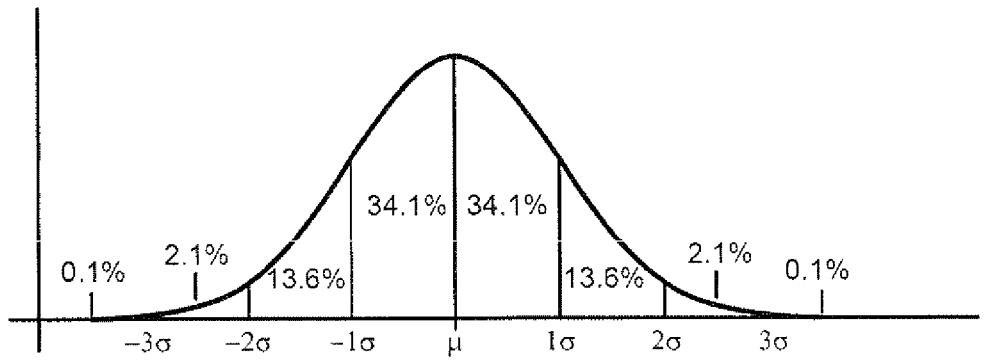
FIG. 10A
| Sigma Value | Cumulative value | Cumulative % | Example Error Rate at EOL |
|---|---|---|---|
| 1σ | 1.59E-01 | 15.86500000% | ... |
| 1.645σ | 5.00E-02 | 5.00000000% | 1 bits |
| 1.960σ | 2.50E-02 | 2.50000000% | ... |
| 2σ | 2.28E-02 | 2.27500000% | 2 bits |
| 2.576σ | 5.00E-03 | 0.50000000% | ... |
| 3σ | 1.35E-03 | 0.13500000% | 4 bits |
| 3.2906σ | 5.00E-04 | 0.05000000% | ... |
| 4σ | 3.17E-05 | 0.00316700% | 8 bits |
| 5σ | 2.87E-07 | 0.00028670% | 30 bits |
| 6σ | 9.86E-10 | 0.00000010% | 42 bits |
| 7σ | 1.28E-12 | 0.00000000% | ... |
FIG. 10B

DATA RECOVERY FOR DEFECTIVE WORD LINES DURING PROGRAMMING OF NON-VOLATILE MEMORY ARRAYS

CROSS-REFERENCE TO RELATED APPLICATIONS

This application is related to U.S. patent application Ser. No. 13/193,083, entitled "Non-Volatile Memory and Method with Accelerated Post-Write Read Using Combined Verification of Multiple Pages" by Eran Sharon, filed Jul. 28, 2013, and to provisional U.S. Patent Application No. 61/512,749, entitled "Post-Write Read in Non-Volatile Memories Using Comparison of Data As Written in Binary and Multi-State Formats" by Eran Sharon and Idan Alrod, filed Jul. 28, 2013.

BACKGROUND OF THE INVENTION

This invention relates generally to semiconductor memory circuits such as electrically erasable programmable read-only memory (EEPROM) and flash EEPROM, and specifically to the recovery of data of defective word-lines in such memory circuits.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are also being implemented. Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common Willis such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Errors in Written Data

In the types of memory systems described herein, as well as in others, including magnetic disc storage systems, the integrity of the data being stored is maintained by use of an error correction technique. Most commonly, an error correction code (ECC) is calculated for each sector or other unit of data that is being stored at one time, and that ECC is stored along with the data. The ECC is most commonly stored together with a unit group of user data from which the ECC has been calculated. The unit group of user data may be a sector or a multi-sector page. When this data is read from the memory, the BCC is used to determine the integrity of the user data being read. Erroneous bits of data within the unit group of data can often be corrected by use of the ECC.

The trend is to reduce the size of the memory systems in order to be able to put more memory cells in the system and to make the system as small as possible to fit in smaller host devices. Memory capacity is increased by a combination of higher integration of circuits and configuring each memory cell to store more bits of data. Both techniques require the memory to operate with increasing tighter margin of error. This in turn places more demand on the ECC to correct errors.

The ECC can be designed to correct a predetermined number of error bits. The more bits it has to correct, the more complex and computationally intensive will the ECC be. For quality assurance, conventional ECC is designed based on the expected worst-case cell error rate at the end of life of the memory device. Thus, they have to correct a maximum number of error bits up to the far tail end of a statistical population of error rate.

As the flash memory ages, its error rate increases rapidly near the end of life of the device. Thus a powerful. ECC designed for the worst-case will only be called to apply its full capacity at the end of life of the memory device.

Using ECC to correct a worst-case number of error bits will consume a great amount processing time. The more bits it has to correct, the more computational time is required. The memory performance will be degraded. Additional dedicated hardware may be implemented to perform the ECC in a reasonable amount of time. Such dedicated hardware can take up a considerable amount of space on the controller ASIC chip. Moreover, for most of the life time of the device, the ECC is only marginally utilized, resulting in its large overheads being wasted and realizing no real benefits.

Consequently, defects often occur in such memory systems, both as part of the manufacturing process as well over the operating life of the device. One of the sources of such defects are the word-lines of such memory arrays, due both to word-line leakage (to another work-line or to the substrate) and to broken word-lines. These word-line related problems typically become more and more acute as device sizes scale down. Some word-line to word-line leakage does not manifest itself when the device is fresh, but only results in a failure after the stress of a number of program-erase cycles. This leakage will cause the faulty word-line to fail to program and corresponding data will be corrupted. A broken word-line will have a high resistive connection, as a result of which the cells on far end of the break will see a voltage drop during program and verify operations. As a result, the threshold voltage distribution for the broken word-line will show un-distinguishable states. Consequently, both of these sorts of defects can be detrimental to memory operation if not detected and lead to the loss of data that is to be written on such word lines.

SUMMARY OF INVENTION

According to a first set of aspects, a memory of operating a memory system including an array of flash memory cells formed along a plurality of word lines each capable of storing one or more pages of data is presented. The method includes receiving a first data page, storing the received first data page in a first buffer, and writing the first data page from the first buffer into a word line of the flash memory. A first page of parity data is generated for the received first page of data and stored in a second buffer. Subsequent to receiving the first data page, one or more additional pages of data are received sequentially, and for each of additional received page of data, the preceding page of received data in the first buffer is replaced with the succeeding page of data, the succeeding page of data is written from the first buffer into a corresponding word line of the flash memory, and the page of parity data stored in the second buffer is updated as a function of previously stored parity data and the page. The method subsequently determines whether the first data page and the additional pages of data were written correctly, and, in response to determining that one of the data pages is written incorrectly, determines the correct data for the incorrectly written page based upon the page of parity data and others of the pages as read from the array.

According to other aspects, a method of operating a memory system is presented, where the memory system includes a memory circuit, the memory circuit having an array of non-volatile memory cells formed along a plurality of word lines each capable of storing one or more pages of data, and a controller circuit controlling the transfer of data between the memory system and a host and managing the storage of data on the memory circuit. The method includes performing a write operation of a plurality of pages of data into the memory array. The write operation includes receiving from the host the plurality of pages at the controller circuit; computing a data check result from the plurality of pages, transferring the plurality of pages from the controller circuit to the memory circuit, and writing the plurality of pages into array. The controller discards one or more of the pages subsequent to being written. The data check result is a many to one transformation such that plurality of data pages cannot be reconstructed based solely upon the data check result. The write operation also includes, subsequent to writing the plurality of pages into the array, performing a post-write verify operation to determine whether the plurality of pages were correctly written, wherein the post-write verify operation is performed as part of the write operation independently of a separate host command for performing it. In response to determining that one of the plurality of pages is not written correctly, and the incorrectly written page being one of the pages discarded by the controller, the method further includes reading one or more of the other data pages from the memory array and reconstructing the first page from the data check result and the other data pages read from the memory array.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 9 illustrates schematically a data page containing an ECC field.

FIG. 10A shows a normal distribution of error rate, with the percentage of the population in various ranges of standard deviations a.

FIG. 10B illustrate the distribution of FIG. 10A in a table format.

DETAILED DESCRIPTION

Memory System

Figure 1:
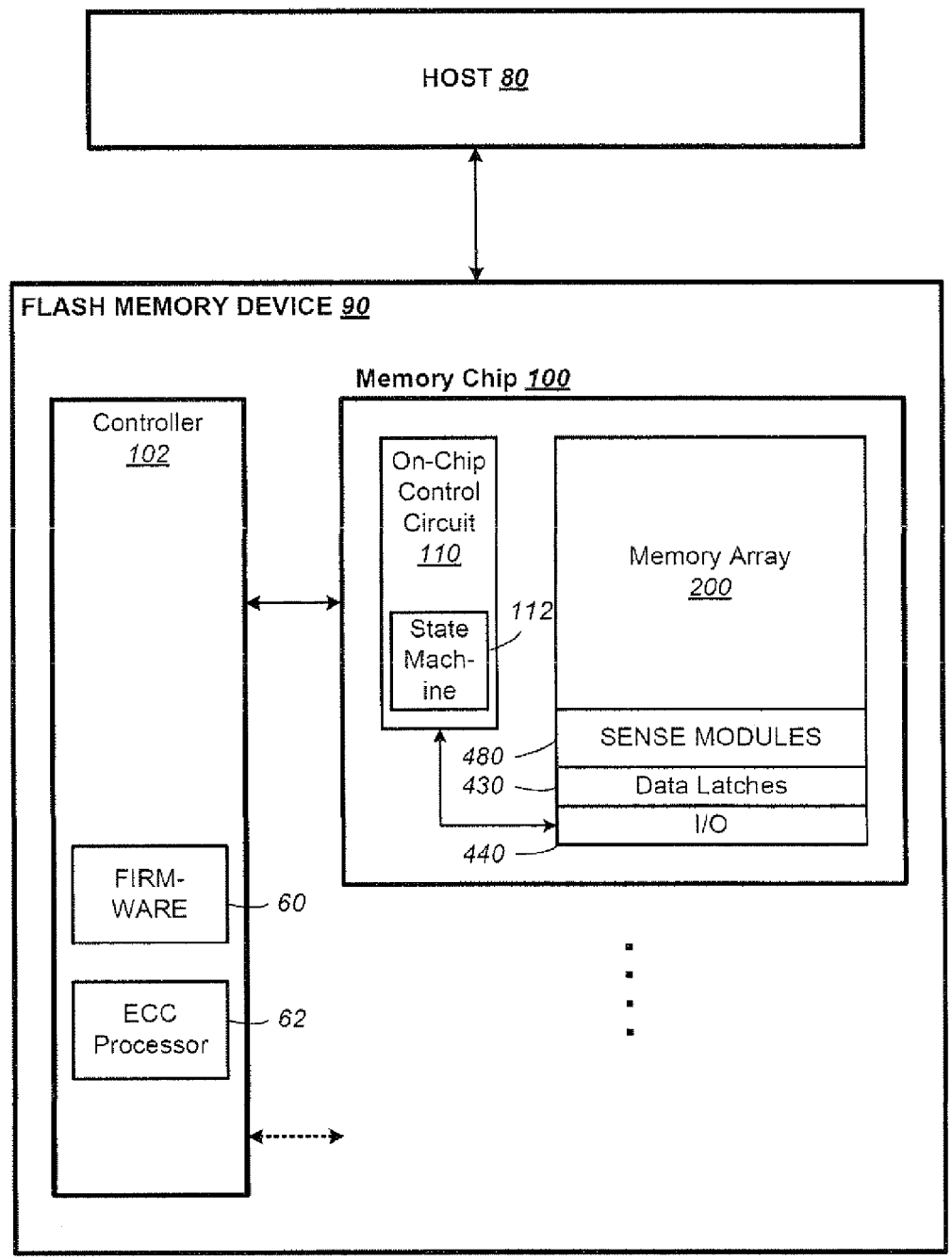
FIG. 1 illustrates a host in communication with a memory device in which the features of the present invention are embodied.

FIG. 1 illustrates a host in communication with a memory device in which the features of the present invention are embodied. The host 80 typically sends data to be stored at the memory device 90 or retrieves data by reading the memory device 90. The memory device 90 includes one or more memory chip 100 managed by a controller 102. The memory chip 100 includes a memory array 200 of memory cells with each cell capable of being configured as a multi-level cell ("MLC") for storing multiple bits of data. The memory chip also includes peripheral circuits such as sense modules 480, data latches 430 and I/O circuits 440. An on-chip control circuitry 110 controls low-level memory operations of each chip. The control circuitry 110 is an on-chip controller that cooperates with the peripheral circuits to perform memory operations on the memory array 200. The control circuitry 110 typically includes a state machine 112 to provide chip level control of memory operations.

In many implementations, the host 80 communicates and interacts with the memory chip 100 via the controller 102. The controller 102 co-operates with the memory chip and controls and manages higher level memory operations. For example, in a host write, the host 10 sends data to be written to the memory array 100 in logical sectors allocated from a file system of the host's operating system. A memory block management system implemented in the controller stages the sectors and maps and stores them to the physical structure of the memory array.

A preferred block management system is disclosed in United States Patent Application Publication No. 2010/0172180 A1, published on Jul. 8, 2010, the entire disclosure of which is incorporated herein by reference.

A firmware 60 provides codes to implement the functions of the controller 102. An error correction code ("ECC") processor 62 processes ECC during operations of the memory device. In another embodiment, the controller 102 is implemented within the host.

Physical Memory Structure

Figure 2:
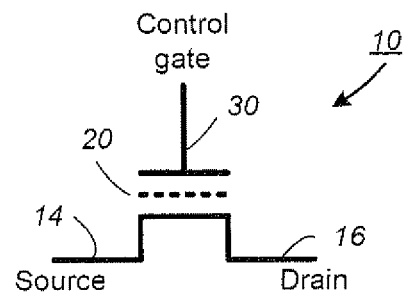
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element. Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Conversely, a threshold voltage is defined as the voltage on the control gate that will just turn on the cell with the given charge. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line or a known capacitor.

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

The memory array 200 is typically organized as a two-dimensional array of memory cells arranged in rows and columns and addressable by word lines and bit lines. The array can be formed according to an NOR type or an NAND type architecture.

Figure 3:
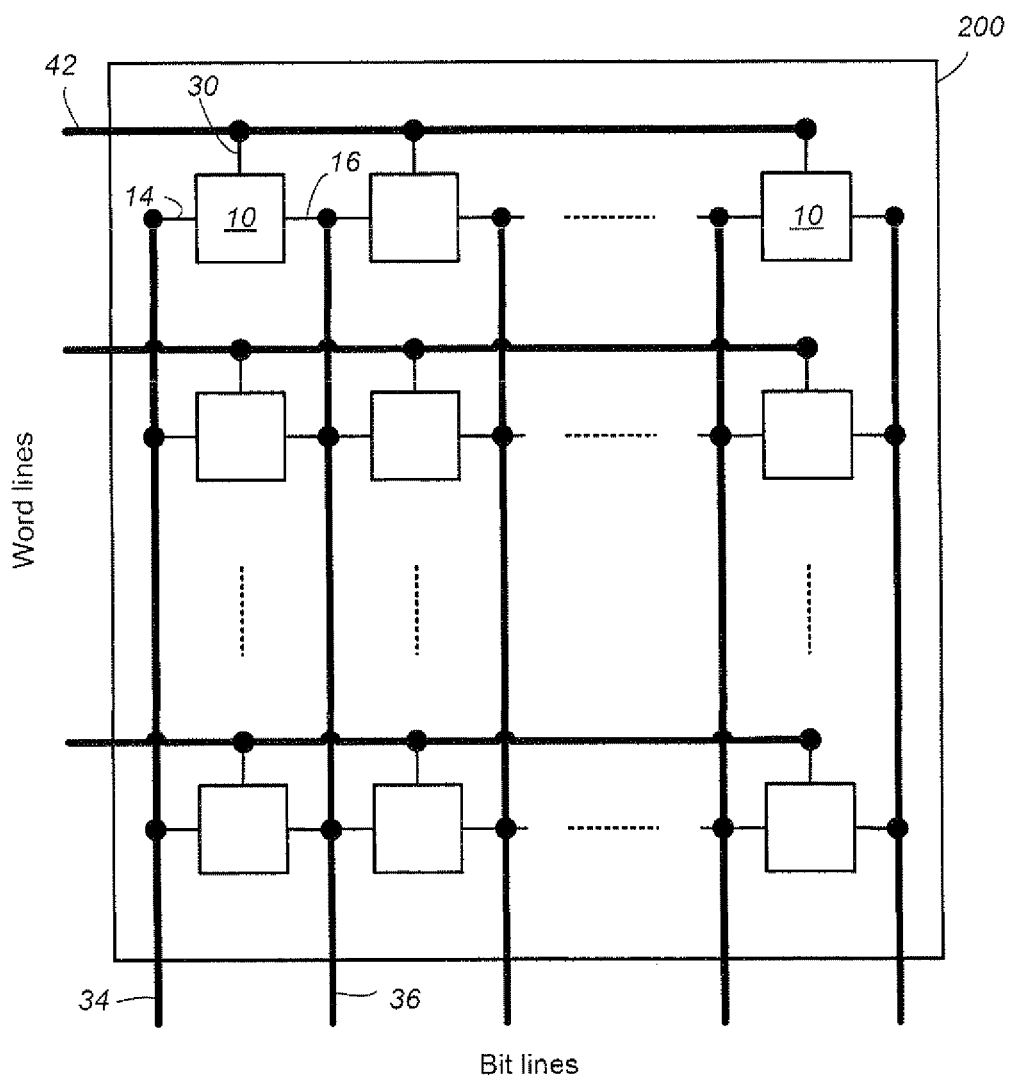
FIG. 3 illustrates an example of an NOR array of memory cells.

FIG. 3 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 4:
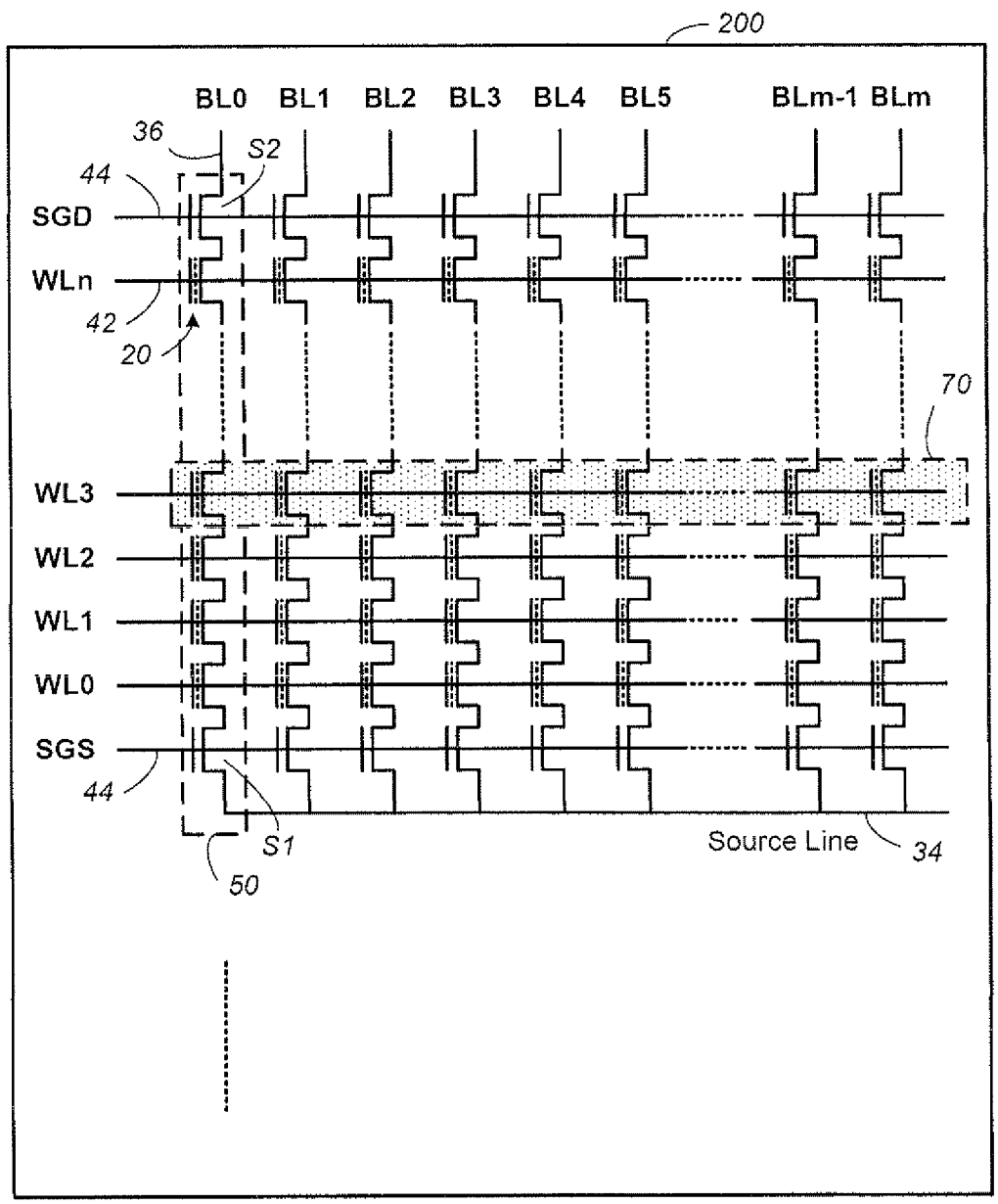
FIG. 4 illustrates a page of memory cells, organized for example in the NAND configuration, being sensed or programmed in parallel.

FIG. 4 illustrates a page of memory cells, organized for example in the NAND configuration, being sensed or programmed in parallel. FIG. 4 essentially shows a bank of NAND strings 50 in the memory array 200. A NAND string 50 comprises of a series of memory transistors (e.g., 4, 8, 16 or higher) daisy-chained by their sources and drains. A pair of select transistors S1, S2 controls the memory transistors chain's connection to the external via the NAND string's source terminal and drain terminal respectively. In a memory array, when the source select transistor S1 is turned on, the source terminal is coupled to a source line 34. Similarly, when the drain select transistor S2 is turned on, the drain terminal of the NAND string is coupled to a bit line 36 of the memory array. Each memory transistor 10 in the chain acts as a memory cell. It has a charge storage element 20 to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control gate of each of the select transistors S1, S2 (accessed via select lines SGS and SGD respectively) provides control access to the NAND string via its source the final and drain terminal respectively.

When an addressed memory transistor 10 within an NAND string is read or is verified during programming, its control gate is supplied with an appropriate voltage via a common word line. At the same time, the rest of the non-addressed memory transistors in the NAND string 50 are fully turned on by application of sufficient voltage on their control gates. In this way, a conductive path is effective created from the source of the individual memory transistor to the source terminal of the NAND string and likewise for the drain of the individual memory transistor to the drain terminal of the cell. Memory devices with such NAND string structures are described in U.S. Pat. Nos. 5,570,315, 5,903,495, 6,046,935.

A "page" such as the page 70, is a group of memory cells enabled to be sensed or programmed in parallel. This is accomplished by a corresponding page of sense amplifiers. For example, the page 70 is along a row and is sensed by a sensing voltage applied to the control gates of the cells of the page connected in common to the word line WL3. Along each column, each cell such as cell 10 is accessible by a sense amplifier via a bit line 36. The page referred to above is a physical page memory cells or sense amplifiers. Depending on context, in the case where each cell is storing.

Sensing Circuits and Techniques

Figure 5A:
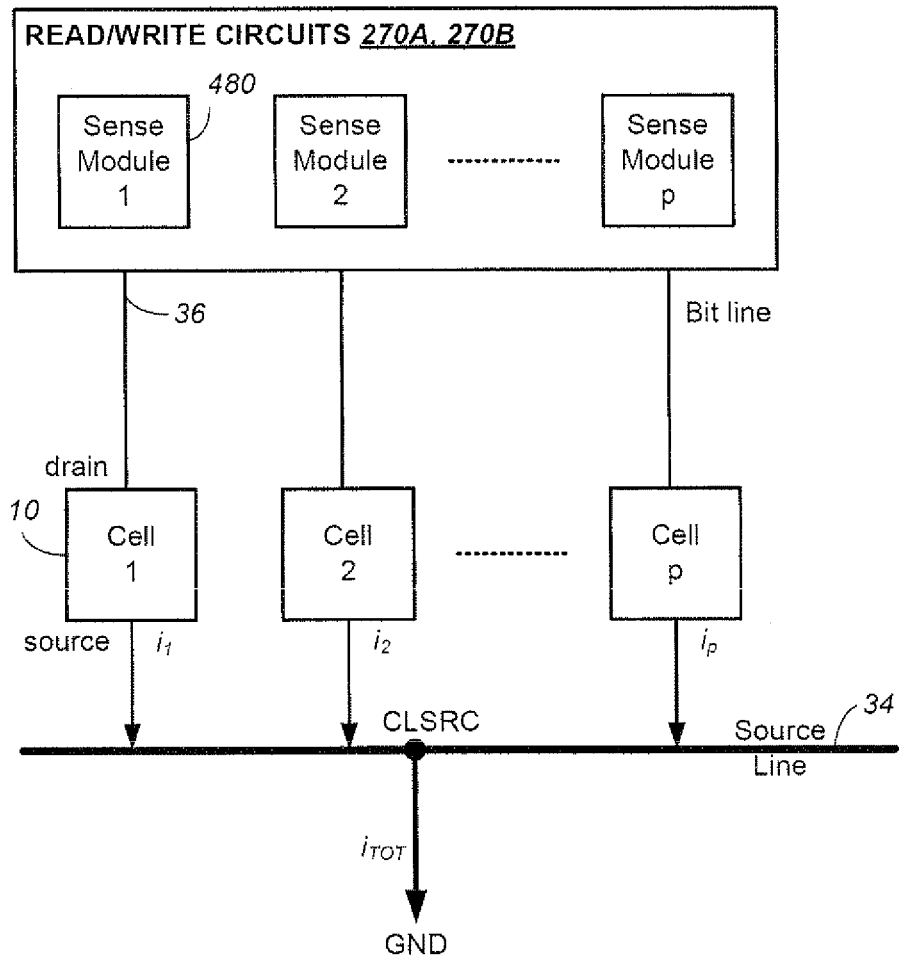
FIG. 5A illustrates in more detail the sense modules shown in FIG. 1 to contain a bank of p sense modules across an array of memory cells.

FIG. 5A illustrates in more detail the sense modules shown in FIG. 1 to contain a bank of p sense modules across an array of memory cells. The entire bank of p sense modules 480 operating in parallel allows a group (or physical page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells.

In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A physical page of sensing circuits is coupled to either the even bit lines or to the odd bit lines at any one time.

In currently produced chips, the physical page may be 64k or larger. In the preferred embodiment, the group is a run of the entire row of cells. This is the so-called "all bit-line" architecture in which the page is constituted from a row of contiguous memory cells coupled respectively to contiguous bit lines.

Figure 5B:
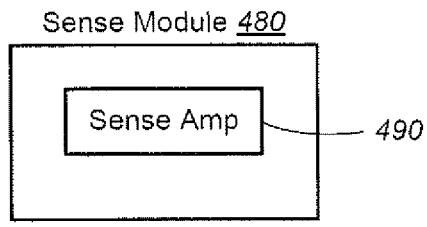
FIG. 5B illustrates a sense module including a sense amplifier.

FIG. 5B illustrates a sense module including a sense amplifier. The sense amplifier 490 detects the conduction current of a cell is above or below a reference level. The sensed results are latches in a corresponding set of latches 430 (see FIG. 1).

Erase Blocks

One important difference between flash memory and other type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together.

Figure 6:
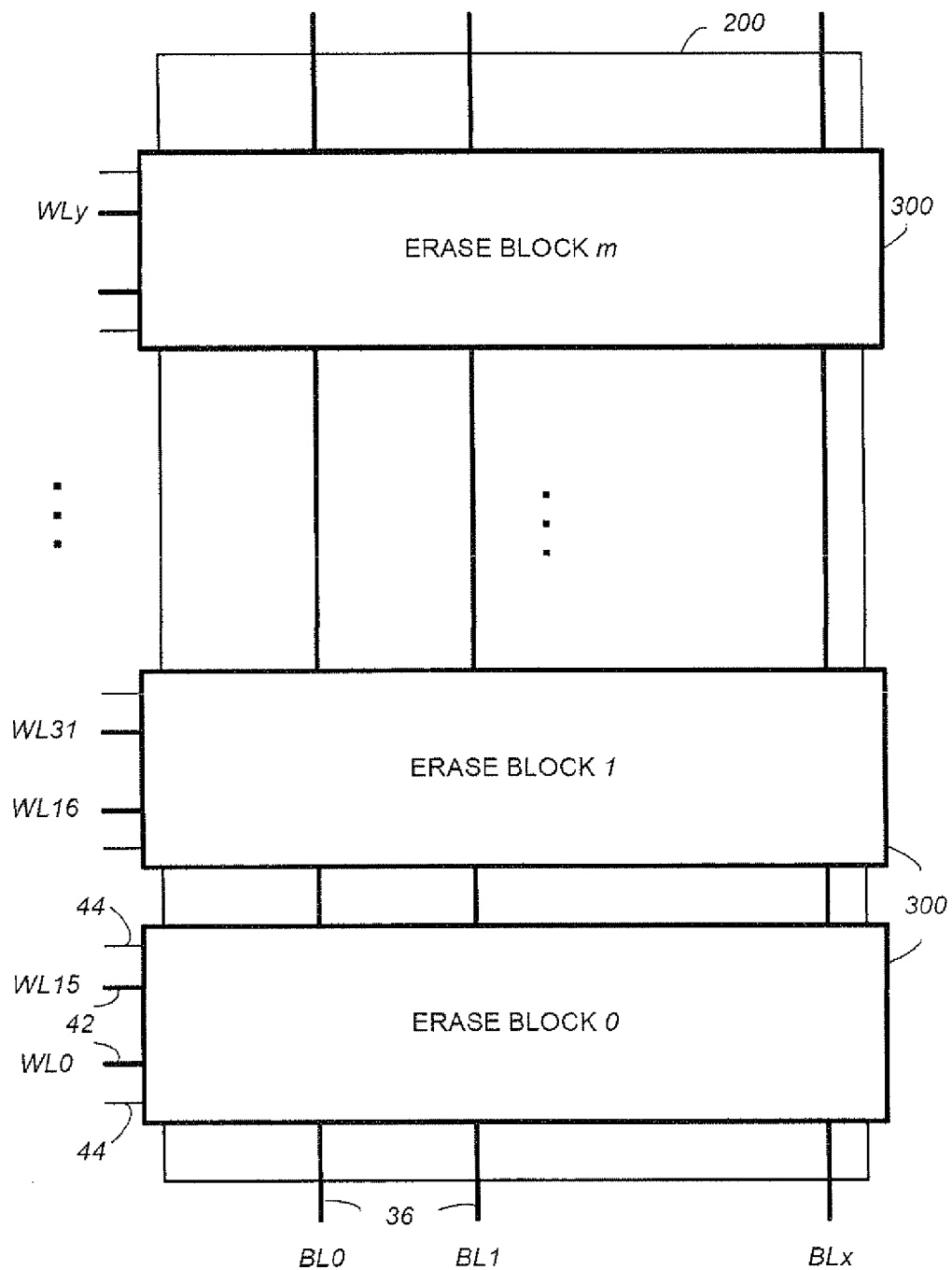
FIG. 6 illustrates schematically an example of a memory array organized in erasable blocks.

FIG. 6 illustrates schematically an example of a memory array organized in erasable blocks. Programming of charge storage memory devices can only result in adding more charge to its charge storage elements. Therefore, prior to a program operation, existing charge in charge storage element of a memory cell must be removed (or erased). A non-volatile memory such as EEPROM is referred to as a "Flash" EEPROM when an entire array of cells 200, or significant groups of cells of the array, is electrically erased together (i.e., in a flash). Once erased, the group of cells can then be reprogrammed. The group of cells erasable together may consist of one or more addressable erase unit 300. The erase unit or block 300 typically stores one or more pages of data, the page being a minimum unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

In the example shown in FIG. 6, individual memory cells in the memory array 200 are accessible by word lines 42 such as WL0-WLy and bit lines 36 such as BL0-BLx. The memory is organized into erase blocks, such as erase blocks 0, 1, . . . m. Referring also to FIGS. 5A and 5B, if the NAND string 50 contains 16 memory cells, then the first bank of NAND strings in the array will be accessible by select lines 44 and word lines 42 such as WL0 to WL15. The erase block 0 is organized to have all the memory cells of the first bank of NAND strings erased together. In another memory architecture, more than one bank of NAND strings may be erased together.

Examples of Binary (SLC) and Multi-State (MLC) Memory Partitioning

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits.

Figure 7:
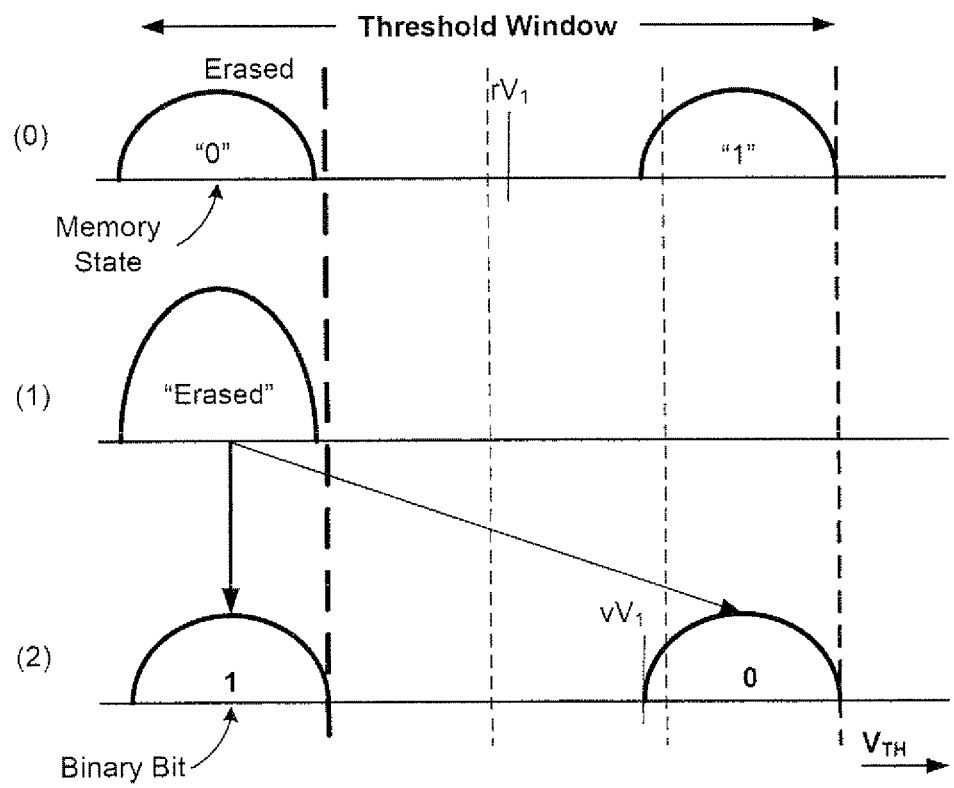
FIG. 7 illustrates a binary memory having a population of cells with each cell being in one of two possible states.

FIG. 7 illustrates a binary memory having a population of cells with each cell being in one of two possible states. Each memory cell has its threshold window partitioned by a single demarcation level into two distinct zones. As shown in FIG. 7(0), during read, a read demarcation level $rV_1$, between a lower zone and an upper zone, is used to determine to which zone the threshold level of the cell lies. The cell is in an "erased" state if its threshold is located in the lower zone and is in a "programmed" state if its threshold is located in the upper zone. FIG. 7(1) illustrates the memory initially has all its cells in the "erased" state. FIG. 7(2) illustrates some of cells being programmed to the "programmed" state. A 1-bit or binary code is used to code the memory states. For example, the bit value "1" represents the "erased" state and "0" represents the "programmed" state. Typically programming is performed by application of one or more programming voltage pulse. After each pulse, the cell is sensed to verify if the threshold has moved beyond a verify demarcation level $vV_1$. A memory with such memory cell partitioning is referred to as "binary" memory or Single-level Cell ("SLC") memory. It will be seen that a binary or SLC memory operates with a wide margin of error as the entire threshold window is only occupied by two zones.

Figure 8:
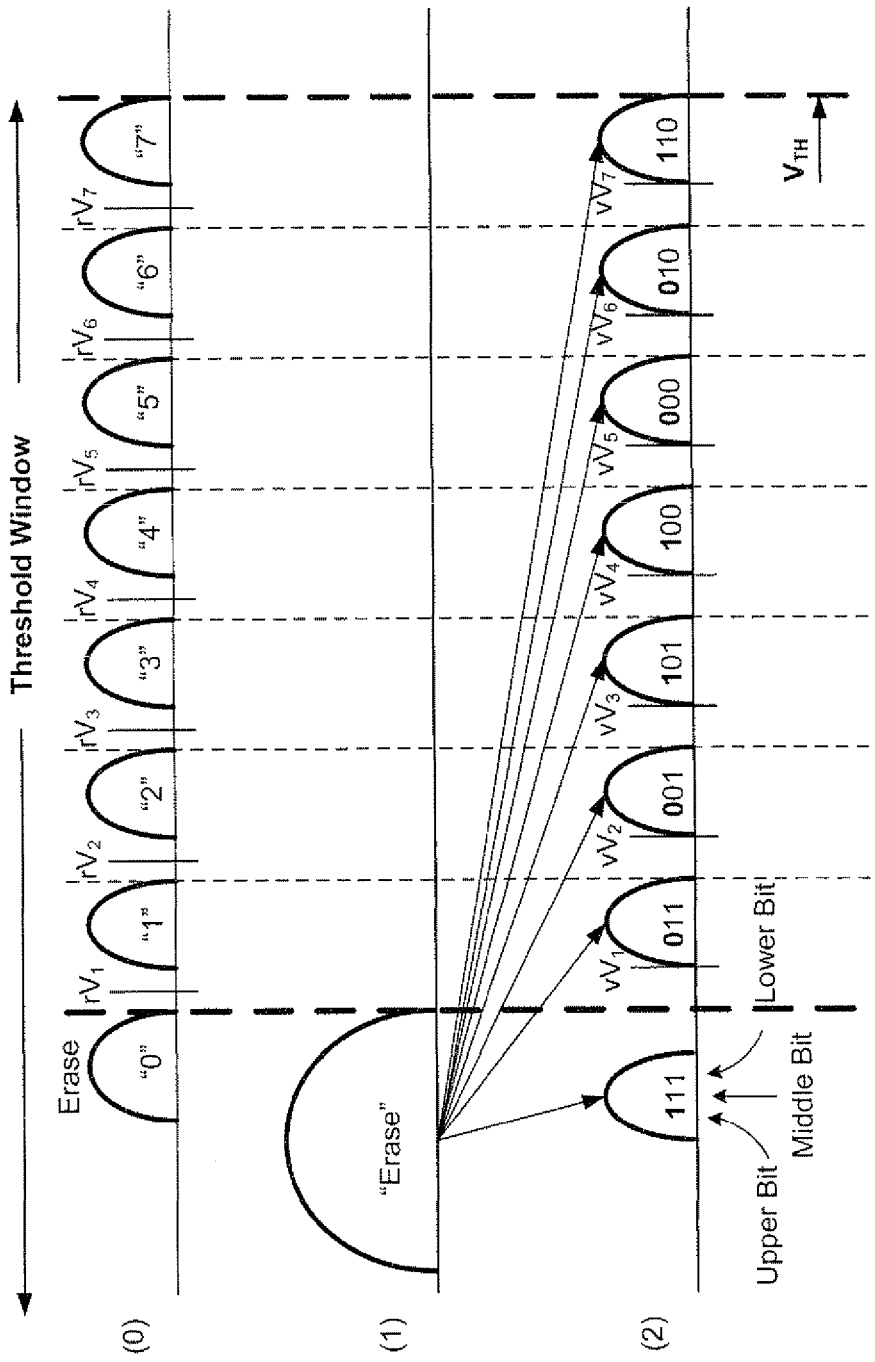
FIG. 8 illustrates a multi-state memory having a population of cells with each cell being in one of eight possible states.

FIG. 8 illustrates a multi-state memory having a population of cells with each cell being in one of eight possible states. Each memory cell has its threshold window partitioned by at least seven demarcation levels into eight distinct zones. As shown in FIG. 8(0), during read, read demarcation levels $rV_1$ to $rV_7$ are used to determine to which zone the threshold level of the cell lies. The cell is in an "erased" state if its threshold is located in the lowest zone and is in one of multiple "programmed" states if its threshold is located in the upper zones. FIG. 8(1) illustrates the memory initially has all its cells in the "erased" state. FIG. 8(2) illustrates some of cells being programmed to the "programmed" state. A 3-bit code having lower, middle and upper bits can be used to represent each of the eight memory states. For example, the "0", "1", "2", "3", "4", "5", "6" and "7" states are respectively represented by "111", "011", "001", "101", "100", "000", "010" and "110". Typically programming is performed by application of one or more programming voltage pulses. After each pulse, the cell is sensed to verify if the threshold has moved beyond a reference which is one of verify demarcation levels $vV_1$ to $vV_7$. A memory with such memory cell partitioning is referred to as "multi-state" memory or Multi-level Cell ("MLC") memory.

Similarly, a memory storing 4-bit code will have lower, first middle, second middle and upper bits, representing each of the sixteen states. The threshold window will be demarcated by at least 15 demarcation levels into sixteen distinct zones.

As the memory's finite threshold window is partitioned into more regions, the resolution for programming and reading will necessarily become finer. Thus, a multi-state or MLC memory necessarily operates with a narrower margin of error compared to that of a memory with less partitioned zones. In other words, the error rate increases with the number of bits stored in each cell. In general, error rate increases with the number of partitioned zones in the threshold window.

Correction by Error Correction Code ("ECC")

Flash memory is prone to errors. To ensure error-free data, an error correction code ("ECC") is implemented to correct errors.

FIG. 9 illustrates schematically a data page containing an ECC field. As described in connection with FIG. 4 and FIG. 6A, a physical page of memory cells is programmed and read in parallel by virtue of a corresponding page of sense modules operating in parallel. When each memory cell stores multiple bits of data, there will be multiple data pages associated with each physical page. The data page 70' comprises a user portion 72' and a system portion 74'. The user portion 72' is for storage of user data. The system portion 74' is generally used by the memory system for storage of system data. Included in the system data is an ECC. The ECC is computed for the data page. Typically, the ECC is computed by the ECC processor 62 in the controller 102 (see FIG. 1.)

As data is received from a host, a page of data is staged in the controller 102 and its ECC 76' is computed by the ECC processor 62. The data page incorporating the ECC is then written to the memory array 200. Typically, when the data page is read, the data page is latched in the data latches 430 and shifted out of the I/O circuits 440 to the controller 102. At the controller 102, the data page's existing ECC is compared to a second version of the ECC computed on the read data. The ECC typically includes an error detection code ("EDC") for rapid detection of any error in the data page. If the EDC indicates the existence of any error in the read data page, the ECC is invoked to correct erroneous bits in the read data page.

The ECC can be designed to correct any number of error bits. The more bits it has to correct, the more complex and computationally intensive will the ECC be. For quality assurance, conventional ECC is designed based on the expected worst case cell error rate ("CER") at the end of life ("EOL") of the memory device. Thus, they have to correct a maximum number of error bits up to the far tail end of a statistical error population.

FIG. 10A shows a normal distribution of error rate with the percentage of the population in various ranges of standard deviations σ. For example, only 2.1% of the population lies within the range from 2σ to 3σ. Only 0.1% of the population lies within the range from 3σ to 4σ.

FIG. 10B illustrate the distribution of FIG. 10A in a table format. It can be seen that only E-09 or one in one billion of the population lies beyond 6σ. The last column in the table shows the estimated error rates for an example memory device in the worst case. For example, 5% of the population will have 1 error bit, 0.135% of the population will have 4 error bits and 1 in 1 billion of the population will have 42 error bits.

Consider a sample of 125 memory cards. Each card has a capacity of 16 GB with data pages of 2 KB each. This amounts to a population of one billion pages of 2 KB each. To ensure not a single page of the sample of 125 memory cards will have an error at the end of life of the card, an ECC capable of correcting up to 42 bits will be needed.

More detail and further development of the preceding sections can be found in US patent publications 2011/0099418 A1, 2011/0099460 A1, and 2011/0096601 A1

Method for Data Recovery in Case of Bad Word Line Detection During Programming

This section looks at the recovery of data during programming, such as in the case of a broken word-line. As device scales decrease, and the length of word lines increase, the occurrence of broken word-lines, leaking word lines and other scale related defects also likely to become more common. The problem of broken and leaking word-lines are discussed in U.S. patent application Ser. No. 12/833,167 filed on Jul. 9, 2010, Ser. No. 13/101,765 filed on May 5, 2011, Ser. No. 12/833,146 filed on Jul. 9, 2010, Ser. No. 13/016,732 filed Jan. 28, 2011, where the first two of these present methods for detecting broken word-lines and the second two present methods for the detection of leaky word-lines. Another approach by which broken word-line failure could be detected is to use a smart verify scheme, such as is described in US patent publications numbers US-2010-0091573-A1 and US-2010-0091568-A1, where the program voltage level is recorded when a certain number of bits pass the lower page program operation on each word-line. Yet another approach to detect this sort of failure is the "forbidden zone" read, where a read is performed to determine whether any cells have a threshold voltages in the region between the ranges allotted to data states (see, for example U.S. Pat. Nos. 7,012,835; 7,616,484; or 7,716,538). One set techniques for identifying broken word-lines and other defects that can manifest themselves during a write operation is known as Enhanced Post Write Read (EPWR).

In an enhanced post write read process, after the data is written (i.e., each of the cells have verified against its target value in the pulse-verify program cycle), it is read back and checked for accuracy. This is typically done at some point a block is written and is usually part of the program sequence, as opposed being executed in response to a command for this from the host. The "enhanced" part is that the process is enhance by techniques to reduce the amount of data to transfer between the host and controller, read less data, execute less frequently, or other accelerate the process. More detail on EPWR processes are presented in US patent publication numbers 2011/0099418 A1, 2011/0099460 A1, and 2011/0096601 A1; U.S. provisional application No. 61/495,053 filed on Jun. 9, 2011; and U.S. application a application Ser. No. 13/193,083, entitled "Non-Volatile Memory and Method with Accelerated Post-Write Read Using Combined Verification of Multiple Pages" by Eran Sharon, filed Jul. 28, 2013.

When programming NAND or other non-volatile memories, there is a problem of possible data loss due to various failure modes such as broken word-lines, word-line to word-line shorts, control gate shorts, and so on. This can especially be a problem when programming directly to multi-state (MLC), where the data is not maintained in, for example, a non-volatile binary cache until checked in a post-write verification. Although such failures can be detected through EPWR, these are typically done only after finishing programming of the entire block. However, if the system detects a bad word-line during EPWR, the data in this bad word-line is lost unless the system has its copy stored in binary non-volatile cache or elsewhere.

One solution for the problem of data loss in case of such failure during \programming is to store the entire block in the controller RAM until the system finish programming the block and checking its validity through EPWR. However, this solution requires a huge amount of controller RAM (typically 2 MB-4 MB), which is usually not acceptable due to high controller cost. Another solution is to perform the EPWR before finishing the programming of the block by, for example, performing it in pipeline: as the memory programs word-line n (WLn), read and verify the validity of WLn-k, for some k≥1, where k is the pipeline depth. This pipeline arrangement would significantly reduce the storage requirements as the system would need to store only k*m pages per die per plane in the controller, where m is the number of pages per word-line (m=2 in a 2-bit per cell arrangement, m=3 for 3 bits per cell). This has two problems: first, the number of pages that need to be stored in the controller may still be too high, especially for multi-die configuration. For example, in a 3-bit per cell arrangement, with 4 dies, 2 planes, and k=2, the number of pages that need to be stored in the controller is 4*3*2*2=48. Assuming 16 KB pages plus redundancy, this adds up to ~800 MB-850 MB of RAM in the controller (depending on the amount of redundancy), which is still too much RAM in most systems. The second problem with this solution is that the system would perform the EPWR of a page before it finishes programming the entire block. This may result in miss-detection of certain failure modes in a word-line that do not occur during the programming of the word-line itself, but rather evolve only later when programming the other word-lines of the block. It is for this reason that EPWR is usually performed only after finishing programming of the entire block.

The solution for the problem of data loss in case of NAND failure during direct MLC programming that is described in this section has several advantages over the prior art solutions. First, it has a much smaller storage requirement in the controller: for example, needing ~50 KB-100 KB, for 3-bits per cell with 4 die and a 2 planes configuration. Second, it allows performing the EPWR operation when programming of the entire block is finished, hence it is more robust as it avoids miss-detection of failures that evolve only after finishing programming the block.

The arrangement described in this section assumes that at most k pages may be corrupted when the system finishes programming a block. Then these corrupted pages can be recovered using an erasure code. In order to recover any k pages, the system will compute and temporarily store k parity pages in the controller. These k parity pages may be computed on-the-fly as the data pages are received from the host. Once programming of the block is finished, EPWR may be done in order to validate that the data is stored reliably. If no problem is detected during EPWR, then the parity pages in the controller may be discarded. In case a problem is detected, and data in at most k pages is corrupt on some bad word-lines, then the missing data is recovered using the k parity pages that are stored in the controller and using the other non-corrupted pages that are read from the block of the memory array and decoded. Once the recovery is complete the block can be reprogrammed and the temporary parity pages in the controller may be discarded upon successfully reprogramming.

One example of a code that can be used is a Reed-Solomon (RS) code (e.g a RS code over $GF(2^8)$). An example of protecting a 2-bit per cell (or "X2") block with 64 word-lines against at most k corrupt pages is shown is illustrated schematically in FIG. 11. The top portion 901 of represents a set of, in this example, 128 pages of data. From these data pages is derived a data check result of k parity pages, represented at 903. The transformation of the data pages in 901 to the k parity pages is many-to-one mapping, so that the system could not recreate the set of data pages 901 from the check result alone due to the information lost in the mapping. The data pages are written into a block of flash memory, while the check data result of 903 will be kept in a buffer allowing it to be updated.

Figure 11:
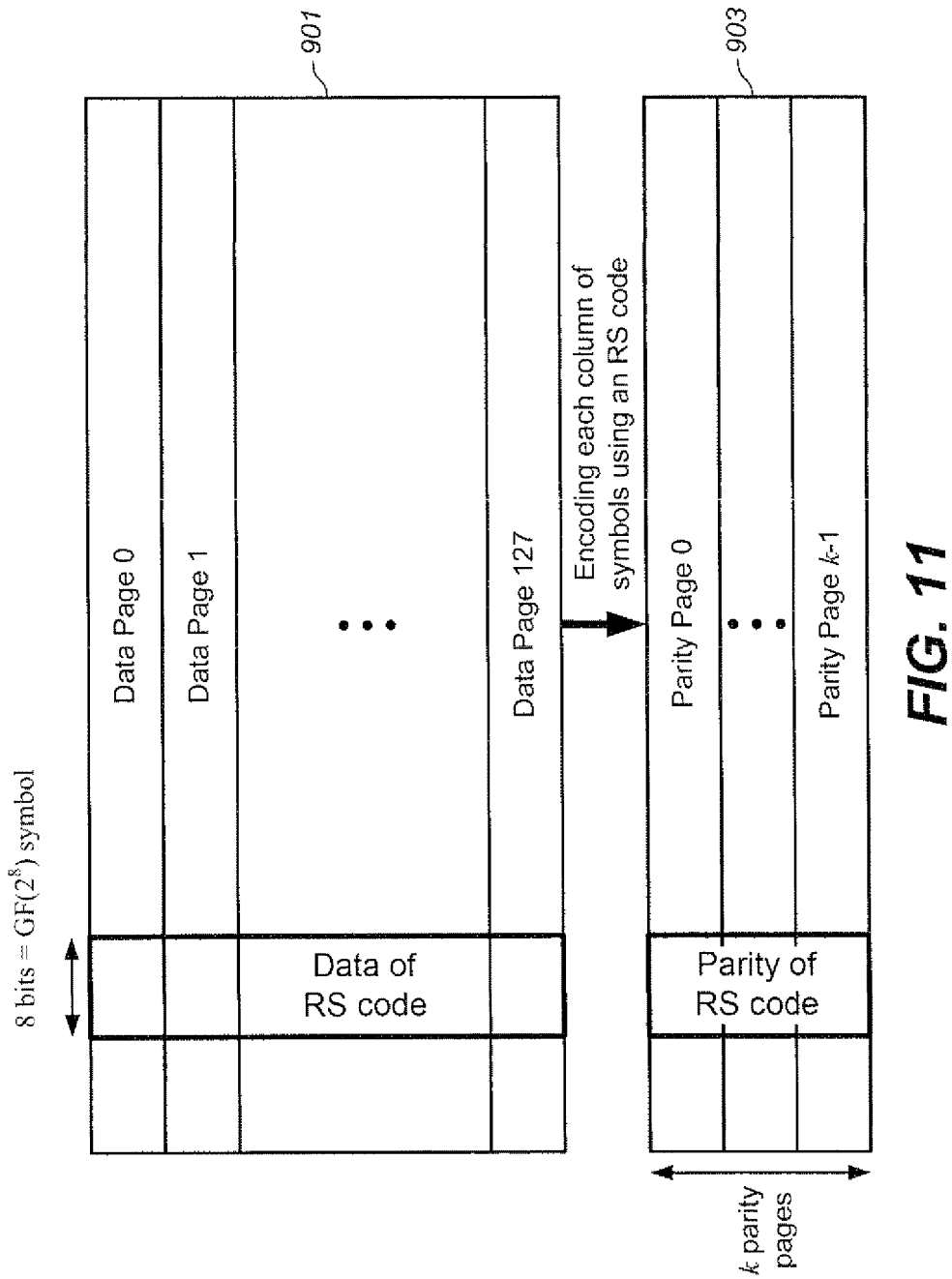
FIG. 11 illustrates an example of protecting a block's worth of memory data with 64 word-lines against at most k corrupt pages.

For example, the content of each column of symbols of 901 can be encoded using a Reed-Solomon (RS) code. In FIG. 11, this is represented for a span of 8 bits using RS code is taken over $GF(2^8)$, the data of the RS code being mapped into the parity of the RS code. In addition to the discussion of the preceding sections, more detail on error correction code can be found in the following US patents, patent publications, and patent application numbers: 2009/0094482; U.S. Pat. No. 7,502,254; 2007/0268745; 2007/0283081; U.S. Pat. Nos. 7,310,347; 7,493,457; 7,426,623; 2007/0220197; 2007/0065119; 2007/0061502; 2007/0091677; 2007/0180346; 2008/0181000; 2007/0260808; 2005/0213393; U.S. Pat. Nos. 6,510,488; 7,058,818; 2008/0244338; 2008/0244367; 2008/0250300; and 2008/0104312.

If certain simplifying assumptions are made on the location of the corrupted pages, such as that they cannot happen at k random pages, but rather at consecutive pages, then the coding scheme may be simplified, such that a set of single parity-check codes can be used instead of an RS code. Such assumptions are reasonable, since the known NAND failure mechanisms such as broken word-lines, word-line to word-line shorts, control gate shorts, and so on affect a single word-line or two adjacent word-lines and hence corrupt two or four consecutive pages (assuming X2).

For example, assume that we only need to protect against a single problematic word-line (e.g. a broken word-line) in block, discussed for a 2-bit per cell (or X2) embodiment. The process can be illustrated with respect to FIG. 12, a simplified diagram of a memory system 1001. Examples of such memory system could be a memory card, an embedded system, an SSD drive, and so on, as discussed above. The system 1001 includes a controller circuit 1003 and one or more memory circuits such as shown at 1011. Both the controller and the memory circuit are simplified for the purposes of this discussion, with those elements not entering in being suppressed. Controller 1003 is shown to include the parity buffer 1007, with the other elements of the controller, including the assorted logic circuitry, ECC circuitry, other RAM and so on, lumped into 1005, where more detail on controllers can be found in the various references cited above. Although the parity buffer 1007 is here shown as a distinct element, various embodiment are possible, including a dedicated memory section or just using the general purpose RAM, the rest of which is lumped into 1005. The memory section is represented by the memory device 1001, where a single page buffer for writing data is shown at 1013 and a single block 1017 of array 1015 is explicitly labeled. More detail on memory circuits is given above and in the references cited above. The data content 901 is written into a block such as 1017 and the parity data 902 is maintained in the buffer 1007. The exemplary embodiment has parity data buffer 1007, but in other cases it could be stored (and computed) by the controller circuitry of the memory circuit.

Under the assumption of a single problematic word-line, the following simple scheme can be used: As the system programs the X2 block 1017, it accumulates in the parity buffer 1007 the XOR of all the lower pages so far, and the XOR of all the upper pages so far (two pages altogether). (Similarly, for an N-bit per MLC embodiment, it would be N pages, with only 1 page for a binary embodiment.) When the system gets to the last page in the block, it has two pages in the controller, one which is the XOR of all the lower pages (called "PXL" in the following) and the other which is the XOR of all the upper pages ("PXU"). When finished programming the data content 901 into the X2 block 1017, the system performs EPWR. If it detects a problem, which affects a single word-line, it can recover the missing data from the two XOR pages and all the other non-problematic word-lines: that is, the lower page of the messed up word-line can be recovered by XORing PXL with the lower pages of all the non-problematic word-lines (that are read from 1017 and decoded). Similarly, it can recover the upper page of the messed up word-line. After the data recovery, the system can reprogram the data 901 and (assuming the subsequent program is successful) can discard the temporary XOR pages (PXL and PXU) from 1007.

Figure 12:
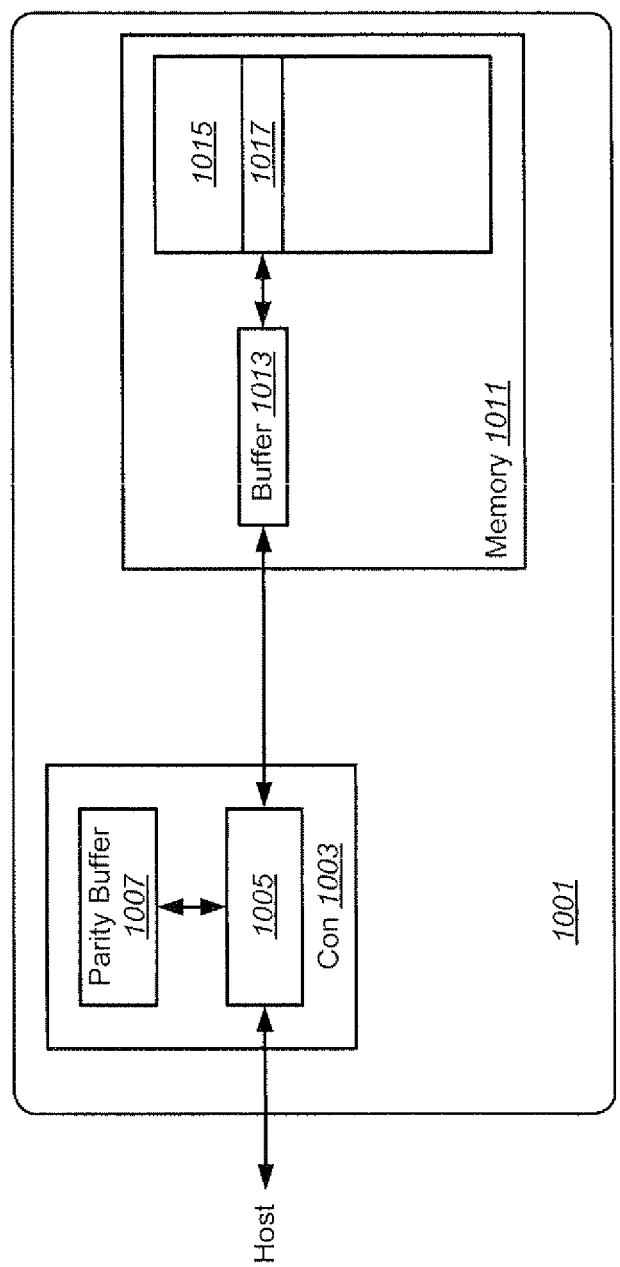
FIG. 12 is a simplified diagram of a memory system in which various aspects of the memory can be implemented.

FIG. 12 only explicitly shows only a single die with a single plane (1011, 1015). More generally, note that the XOR pages (PXL&PXU) can be joined to all dies and all plains. For example in a 4 die and 2 planes per die configuration, PXL will be the XOR of all the lower pages of in all the 4 dies and 2 planes (i.e. XOR of lowers of 8 blocks). This in turn reduces the storage requirement from the controller as we will need only two pages (32 KB+ECC redundancy), regardless of the number of dies and planes per die.

Another variant that can reduce the amount of memory required in the controller, is to store the XOR pages (PXL&PXU) in the Flash latches instead of the controller. More specifically, if there are enough latches in the Flash, then the generation and storage of the XOR pages (PXL&PXU) during programming, may be done internally in the Flash latches (instead of the controller). (More detail on latch structures can be found in U.S. Pat. Nos. 7,158,421 and 7,206,230.)

This simple solution, based on single parity-check codes, can be generalized to deal with a higher number of corrupt consecutive pages. For example, assume that the system needs to protect against at most two adjacent problematic word-lines (this covers problems including broken word-lines, control gate-substrate short circuits, and word-line to word-line shorts). This will require temporarily storing four XOR pages (or, more generally 2N for an N-bit per cell MLC embodiment) in the controller—XOR of all lower pages of even word-lines, XOR of all lower pages of odd word-lines, XOR of all upper pages of even word-lines and XOR of all upper pages of odd word-lines.

As the exemplary embodiment maintains the parity data in volatile memory, power loss in the middle of the block programming, during EPWR, or before the system can manage to recover the data of the bad word-line, will result in losing the temporary parity pages in the controller, and hence will not allow data recovery in case one or more of the pages is corrupt. However, this sort of direct MLC programming may be used in a mode where the host allows for the discarding of an entire block in case of power failure, such as in case of power cycle. Hence, losing the temporary XOR pages during power failure is not an issue in these cases.

Even when direct MLC programming is to be used in other cases, where data loss of the block during power cycle is not allowed, then the techniques of this section may still be usefully employed. The reason is that having both a bad block and an ungraceful power loss during its programming is expected to be rare. So, overall the technique may already reduce the error rate to an acceptable level. Furthermore, it is possible to further reduce the probability of data loss in case that the programming of a block with a NAND failure issue was interrupted by a power cycle. This can be done by storing the temporary XOR pages into non-volatile memory, such as faster binary (or "SLC") non-volatile memory, several times during the MLC programming. For example, once every programming of 8 word-lines, the system can store the currently accumulated XOR pages into SLC. In this case the risk of data loss due to a power cycle is reduced, as now data loss can occur only if there is a power cycle and there is a NAND failure in the current set of 8 word-lines that are programmed. Hence the probability of data loss is reduced by a factor of, for example, ~8/86 (as 8 WLs out of total of, say, 86 word-lines are at risk). This comes at the expense of programming ceil (86/8)=11 SLC pages, which incur both a time penalty and an SLC cycling penalty.

For all of the variations described in this section, the process is part of the post-write read operation that is part of the programming process, and not the reading process (as done in a conventional use of an ECC). Consequently, it deals with actions taken from the time that the system programs the data until the time it acknowledges to the host that the data is reliably stored in the non-volatile memory. Referring back to FIG. 12, as the controller 1003 receives a set of multiple user data pages from the host, each of which is to be stored in the non-volatile memory 1011. The controller computes a transformation of the set of data pages into a check result that is maintains in the buffer 1007. As the parity data does not include all of the information of the pages themselves, it is impossible to recreate the set of data pages from the check result alone. For example, as described above, as the data pages are sequentially received from the host, the page can be XORed with the current corresponding parity data to update the parity information, with the also being transferred on to page buffer 1013 associated with the array. (Where by "corresponding parity data", it is meant corresponding to whether the page is to be written as an upper page, lower page, middle page on a given word-line, and whether there are alternate word-line parity pages and so on.) The pages of data are then written from the buffer 1013 into the assigned block 1017 of the memory 1011.

The controller will not maintain all of the pages of data, typically discarding them after they verify as written or possibly after transferring over to the memory, depending on the specific embodiment. In any case, due to the limited amount of RAM, it is standard for the controller will have discarded at least some of the data pages by the time a block's worth data has been written in. The post-write read is usually done at the block level after a block, or several blocks, has been written. Again, it should be noted that in the exemplary embodiments that the read of the EPWR process is not in response to the controller receiving a read request from the host, but is rather a part of the program sequence as executed by the controller that is included in the autonomous process. If the EPWR operation finds that any of the pages were not written correctly, and was already discarded from the controller, the system reads back at least some of the data pages that were written correctly from the non-volatile memory into the controller and re-creates the data page (or pages) that was not written correctly. The pages read will depend on which (correctly written) pages are needed for the reconstruction. For example, if the data check page were the sort of parity page described above, where the set of pages are XORed together and have only that capacity for recovery of a single page, the all of the pages except for the bad page will be used, so that all of these (that have been discarded) will be read back. It should be noted that when a page is "correctly written", this does not necessarily imply that it is without error, but, rather, that the amount of error is within the correction capabilities of the ECC with which is was encoded.

Figure 13:
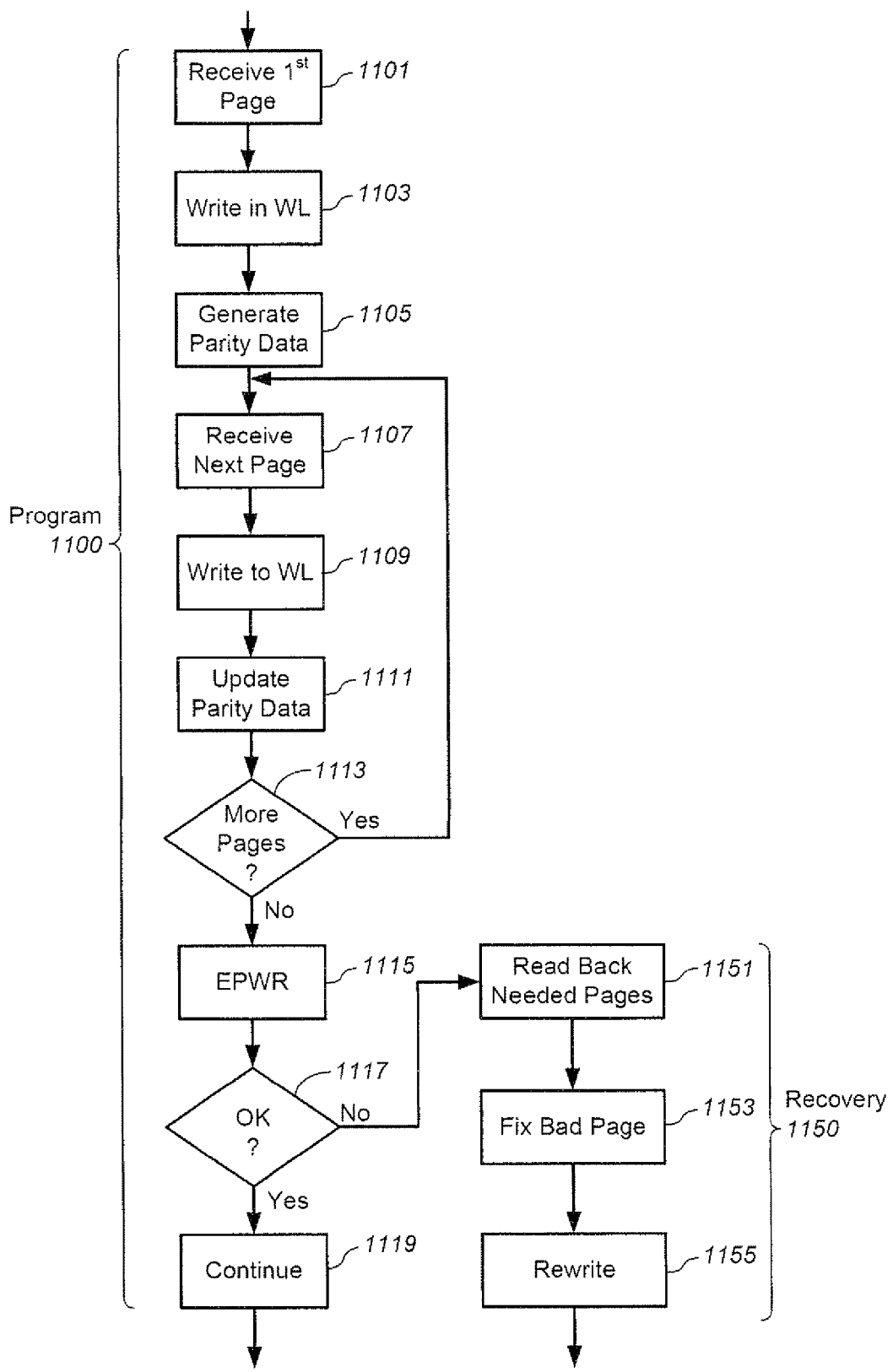
FIG. 13 is a flow chart of an exemplary embodiment illustrating the programming of a block of data and recovering the data from a defective word-line.

Many of these features are illustrated with respect to FIG. 13, which looks at the process for writing in a block of data when, say, storing a stream of host data. The programming operation, or the current portion of a programming operation, 1100 begins at 1101 with the controller receiving a first page of data from the host. This could be the first page of a set of data or picking up the first of a block (or other unit for which EPWR operations are done) at some point in a stream of data. Once on the controller, a page of parity data is generated as a function of the first page of data at 1105 and buffered on the controller. The first page of data is sent across the bus structure to the memory, where is stored in the page buffer associated with the array and the subsequently written into the array 1103. With respect to the order of 1103 and 1105, these can be done in either order or concurrently, based on the implementation. As long as controller is holding a copy of the page, the parity data can be generated, before, after, or while the page is transferred to the memory and programmed into the array.

Note that in the exemplary embodiment the parity data is written into buffer memory, whether in the controller or, alternately, on the memory, so that it can be updated to any value as the subsequent pages are incorporate, as opposed to flash memory that can only be further programmed to higher states unless that whole of a block is erased.

As each subsequent page from the host comes in to the controller (1107), it is buffered on the controller, sent to the memory where it replaces the previous page in the page buffer and is written into the memory (1109), and the page of parity data is updated (1111) as a function of the previously computed parity date and the current page. As space is needed, pages that have already been written can be discarded. If there are more pages for the block (or other group for which the EPWR process will be executed), the flow loops back at 1117. If the block is complete (or there is no further data to write), the ERWR process is then executed at 1115. Again, it should be noted that this is all part of the program process; and, further, is only for a specific block, so that, more generally, this flow is part of a larger loop over multiple block for a stream of data.

At 1117, if the EPWR finds no problems, the memory continues (1119) on with any further data in the next selected block. If, instead, a problem is found, the data recovery operation 1150 is performed. Any pages needed for the reconstruction are read back from the flash array at 1151, except for any that may have not been discarded and are already be in the controller. The data for the bad pages are then reconstructed at 1153, after which the block can be rewritten into a new location at 1155. The recovery can then continue on with the other measures used after a bad EPWR result, such as described in US patent publication numbers 2011/0099418 A1, 2011/0099460 A1, and 2011/0096601 A1; U.S. provisional application No. 61/495,053 filed on Jun. 9, 2011; and U.S. application Ser. No. 13/193,083, entitled "Non-Volatile Memory and Method with Accelerated Post-Write Read Using Combined Verification of Multiple Pages" by Eran Sharon, filed Jul. 28, 2013. For example, the block with the bad word-line is typically marked as defective in the controller's data management structures, so that it is not subsequently used.

Note that in the exemplary embodiment, the post-write verify of the EPWR is done only after finishing the write of all pages of the block, but without the need to store an excessive amount of data on the controller. This can be done as the parity code is gradually computed while pages are being written into the flash and discarded from controller memory. The exemplary embodiment uses volatile memory for the parity code as it is updated page by page as the data comes in, which is not available in flash memory.

CONCLUSION

Although the various aspects of the present invention have been described with respect to certain embodiments, it is understood that the invention is entitled to protection within the full scope of the appended claims.

It is claimed:

1. A method of operating a memory system including an array of flash memory cells formed along a plurality of word lines each capable of storing one or more pages of data, the method comprising:
   receiving a first data page;
   storing the received first data page in a first buffer;
   writing the first data page from the first buffer into a corresponding word line of the flash memory;
   generating a page of parity data for the received first page of data;
   storing the page of parity data in a second buffer;
   subsequent to receiving the first data page, sequentially receiving one or more additional pages of data, and for each of additional received page of data;
      overwriting the preceding page of received data in the first buffer therewith;
      writing the page of data from the first buffer into a corresponding word line of the flash memory; and
      updating the page of parity data stored in the second buffer as a function of parity data as previously stored in the second buffer and the additional received page of data;
   subsequently determining whether the first data page and the additional pages of data were written correctly; and
   in response to determining that one of the data pages is written incorrectly, determining the correct data for the incorrectly written page based upon the page of parity data and the first and additional data pages as read from the array.

2. The method of claim 1, wherein overwriting the preceding page step is performed after verifying the completion of writing the first data page.

3. The method of claim 1, wherein the memory system includes a memory circuit, including the array, and a controller circuit, wherein the page of parity data is generated by logic circuitry on the controller circuit and the second buffer is formed on the controller circuit.

4. The method of claim 1, wherein determining whether the first data page and the additional pages of data were written correctly includes determining whether the pages individually have an acceptable amount of error.

5. The method of claim 4, whether each of the pages of data includes a user data portion and a corresponding error correction code (ECC) portion and wherein determining whether the pages individually have an acceptable amount of error comprises being able to read to read the user data portion using the corresponding ECC.

6. The method of claim 5, wherein the memory system includes a memory circuit, including the array, and a controller circuit, including ECC circuitry, and wherein the corresponding ECC is generated by the ECC circuitry.

7. The method of claim 1, wherein updating the page of parity data in the second buffer as a function of the previously stored parity data and the page comprises:
   performing an exclusive OR operation of the contents of the second data buffer with the page; and
   storing the result in the second buffer.

8. The method of claim 1, wherein updating the page of parity data in the second buffer as a function of the previously stored parity data and the page comprises:
   computing an erasure correction code parity page from the contents of the second data buffer and the page; and
   storing the result in the second buffer.

9. The method of claim 8, wherein the memory system includes a memory circuit, including the array, and a controller circuit, wherein the page of parity data is generate by logic circuitry on the controller circuit.

10. The method of claim 1, further comprising:
    re-writing the corrected data for the incorrectly written page to a new location.

11. The method of claim 10, wherein the array is formed of a plurality of erase blocks each having a plurality of word lines, the method further comprising:
    re-writing the corrected data for the incorrectly written page and the other pages of data of the block to which the incorrectly written page was incorrectly written to a different block; and
    marking the block to which the incorrectly written page was incorrectly written as defective in a memory management structure for the memory system.

12. The method of claim 1, wherein the memory cells are multistate cells storing N-bits per cell, N being an integer two or greater, and the word lines each capable of storing N logical pages arranged as an upper-most logical page to a lower-most logical page, wherein writing the first data page and the additional pages of data into corresponding word lines comprises:
    writing each of the first data page and the additional pages of data into a first of the logical pages that is the same on each of the corresponding word lines.

13. The method of claim 12, further comprising:
    receiving a second plurality of data pages, the second set having the same number of pages as the first data page and the additional pages of data;
    generating a second page of parity data for the second set of data pages;
    storing the second page of parity data in the second buffer, where the second buffer can hold the second page of parity data concurrently with the parity data generated as a function of the first data page and the additional pages of data;

writing each of the second set of data pages into a second of the logical pages that is the same on each of the corresponding word lines, the second of the logical pages being different than the first of the logical pages;

subsequently determining whether the second set of data pages was written correctly; and in response to determining that a first page of the second set of data pages is written incorrectly, determining the correct data for the incorrectly written page based upon the second page of parity data and others of the pages of the second set of pages as read from the array.

14. The method of claim 13, wherein the array is formed of a plurality of erase blocks each having a plurality of word lines, and wherein the corresponding plurality of word lines are all of the word lines of a block.

15. The method of claim 13, wherein the array is formed of a plurality of erase blocks each having a plurality of word lines, and wherein the corresponding plurality of word lines are every other word line of a block.

16. The method of claim 15, further comprising:
receiving third and fourth sets of data pages, the third and fourth sets having the same number of pages;
generating a third and a fourth page of parity data respectively for each of the third and fourth sets of data pages;
storing the third and fourth pages of parity data in the second buffer, where the second buffer can hold the second, third and fourth pages of parity data concurrently with the generated as a function of the first data page and the additional pages of data;
writing each of the third and fourth set of data pages respectively into the first and second of the logical pages on each of the alternate word lines that are not written with the first and second sets of data;
subsequently determining whether the third or fourth set of data pages was written correctly; and
in response to determining that a first page of one or both of the third and fourth set of data pages is written incorrectly, determining the correct data thereof based upon the corresponding page of parity data and others of the pages of the corresponding set of pages as read from the array.

17. The method of claim 1, wherein the array is formed of a plurality of erase blocks each having a plurality of word lines, and wherein the corresponding plurality of word lines are from the same block.

18. The method of claim 1, wherein the array is formed of a plurality of erase blocks each having a plurality of word lines, and wherein the corresponding plurality of word lines are every other word line of a block.

19. The method of claim 18, further comprising:
receiving a second plurality of data pages;
generating a second page of parity data for the second set of data pages;
storing the second page of parity data in the second buffer, where the second buffer can hold the second page of parity data concurrently with the parity data generated as a function of the first data page and the additional pages of data;
writing the second set of data pages respectively into the alternate word lines that are not written with the first data page and the additional pages of data;
subsequently determining whether the second set of data pages was written correctly; and
in response to determining that a first page of the second set of data pages is written incorrectly, determining the correct data for the incorrectly written page based upon the second page of parity data and others of the pages of the second set of pages as read from the array.

20. In a non-volatile memory system including a memory circuit, the memory circuit having an array of non-volatile memory cells formed along a plurality of word lines each capable of storing one or more pages of data, and a controller circuit controlling the transfer of data between the memory system and a host and managing the storage of data on the memory circuit, a method of operating the memory system, comprising:
performing a write operation of a plurality of pages of data into the memory array, including:
receiving from a host the plurality of pages of data at the controller circuit;
computing a data check result from the plurality of pages of data wherein the data check result is a many to one transformation such that plurality of data pages cannot be reconstructed based solely upon the data check result;
transferring the plurality of pages of data from the controller circuit to the memory circuit;
writing the plurality of pages of data into array;
discarding by the controller of one or more of the pages; and
subsequent to writing the plurality of pages of data into the array, performing a post-write verify operation to determine whether the plurality of pages of data were correctly written, wherein the post-write verify operation is performed as part of the write operation independently of a separate host command therefor; and
in response to determining that a first of the plurality of pages of data is not written correctly, the determined incorrectly written page being one of the pages discarded by the controller, reading one or more of the other data pages from the memory array and reconstructing the first page from the data check result and the other data pages read from the memory array.

21. The method of claim 20, wherein the controller discards said one or more pages subsequent to the transfer thereof to the memory circuit.

22. The method of claim 20, wherein the controller discards said one or more pages subsequent to the completion of the writing thereof.

23. The method of claim 20, wherein the controller discards said one or more pages subsequent to the completion of the writing and verification thereof.

24. The method of claim 20, wherein the data check result is generated by logic circuitry on the controller circuit and maintained in a buffer memory on the controller circuit.

25. The method of claim 20, wherein the data check result is computed using an erasure code encoder.

26. The method of claim 20, wherein the data check result is computed using an RS encoder.

27. The method of claim 20, wherein the data check result is computed as an exclusive OR operation of multiple ones of the plurality of pages of data.

28. The method of claim 20, further comprising:
re-writing the reconstructed first page to a new location on the memory circuit.

29. The method of claim 28, wherein the array is formed of a plurality of erase blocks each having a plurality of word lines, the method further comprising:
re-writing the reconstructed first page and the others of the plurality of pages of data of the block to which the first page was incorrectly written to a different block; and marking the block to which the first page was incorrectly written as defective in a memory management structure for the memory system.

30. The method of claim 20, wherein the memory cells are multistate cells storing N-bits per cell, N being an integer two or greater, and the word-lines each capable of storing N logical pages, and wherein the plurality of pages of data includes first and second subsets each of multiple pages, wherein the first set of pages being written as lower logical pages on a corresponding set of multiple word-lines and the second set of pages begin written as upper logical pages the corresponding set of multiple word-lines, and wherein the data check result includes first and second data check results respectively computed from the first and second subsets, the method further including:

in response to determining that one of the pages of the first subset is not written correctly, the determined incorrectly written page being one of the pages discarded by the controller, reading one or more of the other data pages of the first subset from the memory array and reconstructing the incorrectly written page of the first subset from the first data check result and the other data pages of the first subset read from the memory array; and in response to determining that one of the pages of the second subset is not written correctly, the determined incorrectly written page being one of the pages discarded by the controller, reading one or more of the other data pages of the second subset from the memory array and reconstructing the incorrectly written page of the second subset from the second data check result and the other data pages of the second subset read from the memory array.

31. The method of claim 30, wherein the first and second subsets are written into alternate ones of the word-lines, and wherein the plurality of pages of data further includes third and fourth subsets each of multiple pages, wherein the third set of pages being written as lower logical pages on a corresponding set of multiple word-lines and the fourth set of pages begin written as upper logical pages the corresponding set of multiple word-lines, the third and fourth subsets being written into the alternate ones of the word-lines not used for the first and second subsets, and wherein the data check result further includes third and fourth data check results respectively computed from the third and fourth subsets, the method including:

in response to determining that one of the pages of the third subset is not written correctly, the determined incorrectly written page being one of the pages discarded by the controller, reading one or more of the other data pages of the third subset from the memory array and reconstructing the incorrectly written page of the third subset from the third data check result and the other data pages of the third subset read from the memory array; and in response to determining that one of the pages of the fourth subset is not written correctly, the determined incorrectly written page being one of the pages discarded by the controller, reading one or more of the other data pages of the fourth subset from the memory array and reconstructing the incorrectly written page of the fourth subset from the fourth data check result and the other data pages of the fourth subset read from the memory array.

* * * * *